(12) United States Patent
Kobashi et al.

(10) Patent No.: US 11,832,466 B2
(45) Date of Patent: Nov. 28, 2023

(54) ELECTROLUMINESCENT ELEMENT AND DISPLAY DEVICE

(71) Applicant: SHARP KABUSHIKI KAISHA, Sakai (JP)

(72) Inventors: Tadashi Kobashi, Sakai (JP); Kenichi Yoshimura, Sakai (JP); Masashi Kago, Sakai (JP); Noboru Iwata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 390 days.

(21) Appl. No.: 17/265,013

(22) PCT Filed: Aug. 3, 2018

(86) PCT No.: PCT/JP2018/029282
§ 371 (c)(1),
(2) Date: Feb. 1, 2021

(87) PCT Pub. No.: WO2020/026446
PCT Pub. Date: Feb. 6, 2020

(65) Prior Publication Data
US 2021/0313534 A1 Oct. 7, 2021

(51) Int. Cl.
*H01L 51/50* (2006.01)
*H10K 50/115* (2023.01)
*C09K 11/08* (2006.01)
*C09K 11/70* (2006.01)
*C09K 11/88* (2006.01)
(Continued)

(52) U.S. Cl.
CPC ........ *H10K 50/115* (2023.02); *C09K 11/0883* (2013.01); *C09K 11/70* (2013.01); *C09K 11/883* (2013.01); *H10K 50/15* (2023.02); *H10K 50/16* (2023.02); *H10K 50/818* (2023.02); *H10K 50/828* (2023.02); *H10K 59/12* (2023.02); *B82Y 20/00* (2013.01); *H10K 2102/3026* (2023.02); *H10K 2102/3035* (2023.02); *H10K 2102/331* (2023.02); *H10K 2102/351* (2023.02)

(58) Field of Classification Search
CPC ..... H10K 50/115; H10K 50/15; C09K 11/883
See application file for complete search history.

(56) References Cited

U.S. PATENT DOCUMENTS

2012/0138894 A1 6/2012 Qian et al.
2015/0093583 A1 4/2015 Hosono et al.
(Continued)

FOREIGN PATENT DOCUMENTS

JP 2001-210865 A 8/2001
JP 2010-009995 A 1/2010
(Continued)

*Primary Examiner* — Anthony Ho
(74) *Attorney, Agent, or Firm* — ScienBiziP, P.C.

(57) ABSTRACT

An electroluminescent element according to an aspect of the disclosure includes: a pair of a cathode electrode and an anode electrode; a light-emitting layer provided between the cathode electrode and the anode electrode; an electron transport layer provided between the cathode electrode and the light-emitting layer; and a hole transport layer provided between the anode electrode and the light-emitting layer. The light-emitting layer includes ZnSe-based quantum dots including ZnSe and one of the electron transport layer and the hole transport layer is composed of ZnO particles having an average particle size of 3 nm or greater and 30 nm or less.

12 Claims, 8 Drawing Sheets

(51) Int. Cl.
*H10K 50/15* (2023.01)
*H10K 50/16* (2023.01)
*H10K 50/818* (2023.01)
*H10K 50/828* (2023.01)
*H10K 59/12* (2023.01)
*B82Y 20/00* (2011.01)
*H10K 102/00* (2023.01)

(56) References Cited

U.S. PATENT DOCUMENTS

| | | |
|---|---|---|
| 2015/0137103 A1 | 5/2015 | Hosono et al. |
| 2018/0182967 A1 | 6/2018 | Ito et al. |
| 2019/0172605 A1 | 6/2019 | Hosono et al. |

FOREIGN PATENT DOCUMENTS

| | | |
|---|---|---|
| JP | 2012-533156 A | 12/2012 |
| JP | 2015-187942 A | 10/2015 |
| JP | 2018-104674 A | 7/2018 |
| WO | 2011/005859 A2 | 1/2011 |
| WO | 2011/005859 A3 | 4/2011 |
| WO | 2013/191212 A1 | 12/2013 |

ELECTROLUMINESCENT ELEMENT AND DISPLAY DEVICE

TECHNICAL FIELD

The disclosure relates to an electroluminescent element and a display device. The disclosure relates particularly to a quantum dot light emitting diode (QLED) and a QLED display device.

BACKGROUND ART

In recent years, various flat panel displays have been developed, and in particular, QLED display devices each provided with a QLED as an electroluminescent element have been attracting a lot of attention as excellent flat panel displays because of high luminous efficiency and high color purity.

Many of the QLED display devices use ZnO for a charge transport layer between a light-emitting layer and an electrode. PTLs 1 and 2 each disclose an electroluminescent element in which a sintered body of ZnO is used as an electron transport layer.

CITATION LIST

Patent Literature

PTL 1: WO 2013/191212 (issued on May 26, 2016)
PTL 2: JP 2001-210865 A (published on Aug. 3, 2001)

SUMMARY

Technical Problem

Incidentally, light emission of a ZnSe-based quantum dot (QD), which is one of Cd-free QDs, is susceptible to light absorption and light emission by ZnO. Thus, a QLED including a light-emitting layer containing ZnSe-based QDs and an electron transport layer containing ZnO has a problem in that the color purity is low.

PTLs 1 and 2 merely suggest that a sintered body of ZnO is transparent, with regard to the optical properties of the sintered body of ZnO.

The disclosure has been made in view of the problems described above, and an object of the disclosure is to improve color purity in an electroluminescent element including a light-emitting layer containing ZnSe-based QDs and an electron transport layer containing ZnO.

Solution to Problem

An electroluminescent element according to an aspect of the disclosure includes: a pair of a cathode electrode and an anode electrode; a light-emitting layer provided between the cathode electrode and the anode electrode; an electron transport layer provided between the cathode electrode and the light-emitting layer; and a hole transport layer provided between the anode electrode and the light-emitting layer, in which the light-emitting layer includes ZnSe-based quantum dots including ZnSe, and one of the electron transport layer and the hole transport layer is composed of ZnO particles having an average particle size of 3 nm or greater and 30 nm or less.

Advantageous Effects of Disclosure

According to the electroluminescent element according to an aspect of the disclosure, luminous efficiency can be improved.

Figure 4:
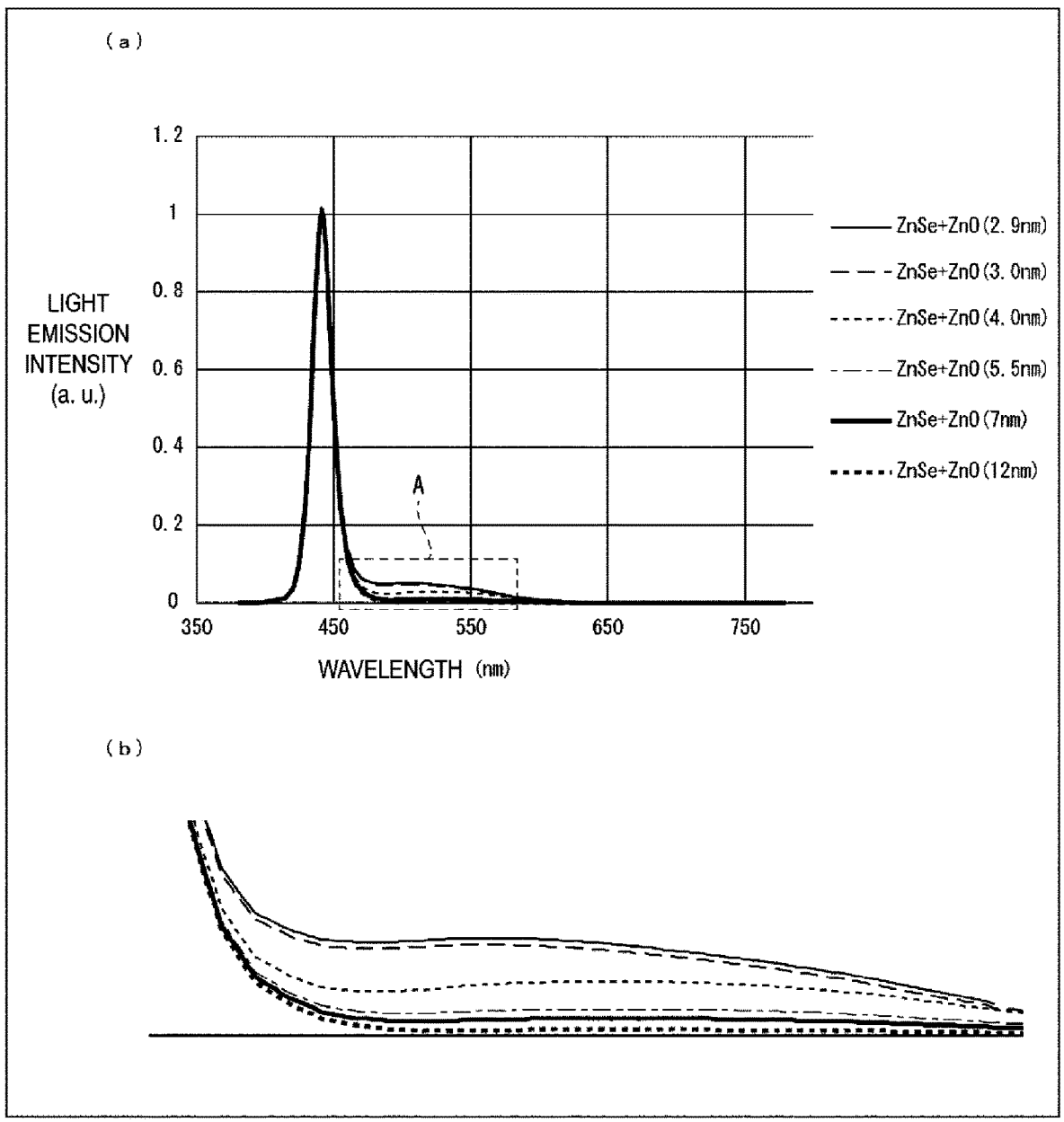

(a) of FIG. 4 is a diagram illustrating emission spectra of various blue light-emitting devices in which an electron injection and electron transport layer is composed of ZnO particles. (b) of FIG. 4 is an enlarged view of a portion surrounded by A in (a) of FIG. 4.

Figure 5:
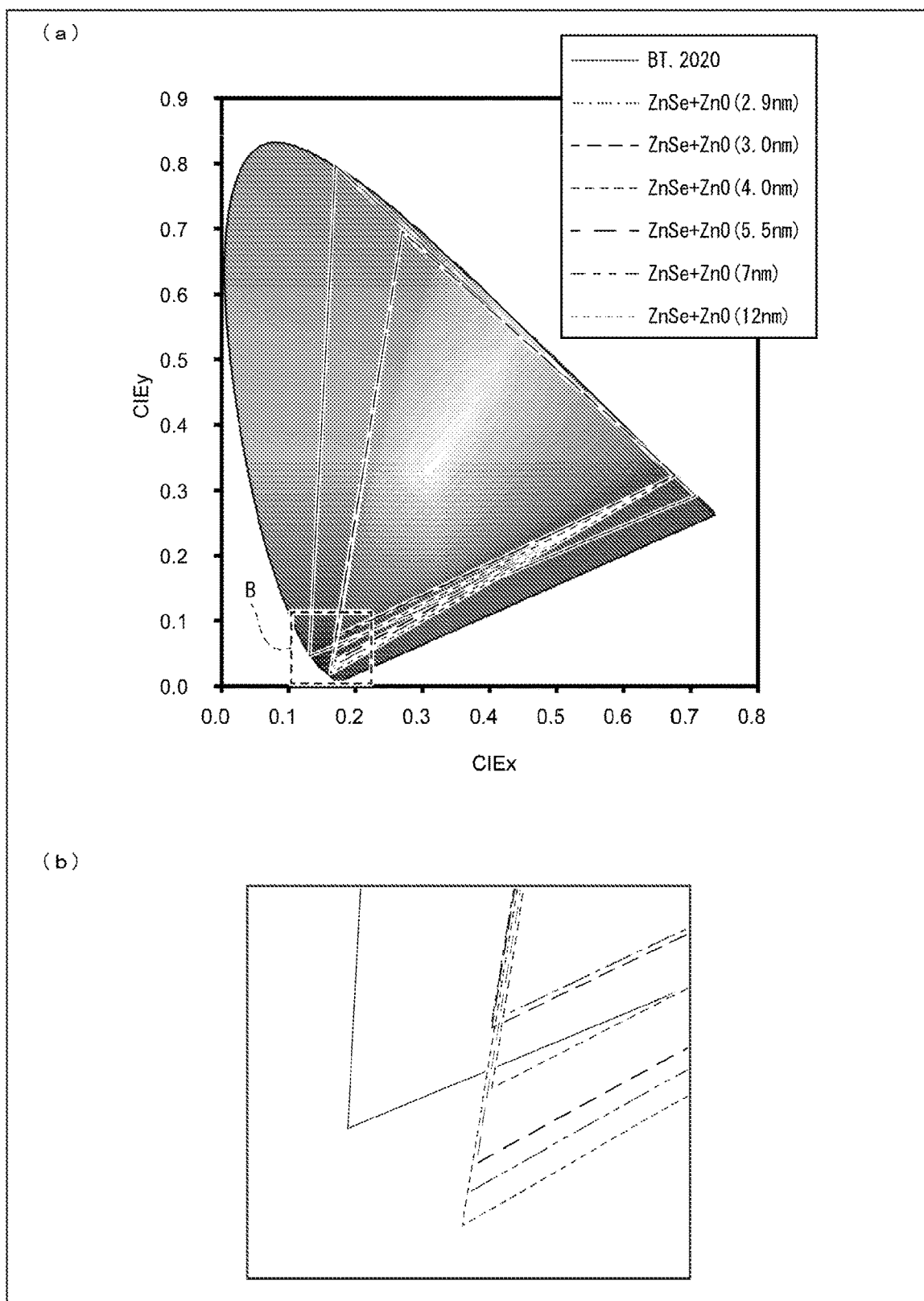

(a) of FIG. 5 is a CIE1931xy chromaticity diagram showing BT.2020 and a color gamut representable by various display devices in which the electron injection and electron transport layer is composed of ZnO particles. (b) of FIG. 5 is an enlarged view of a portion surrounded by B in (a) of FIG. 5.

Figure 6:
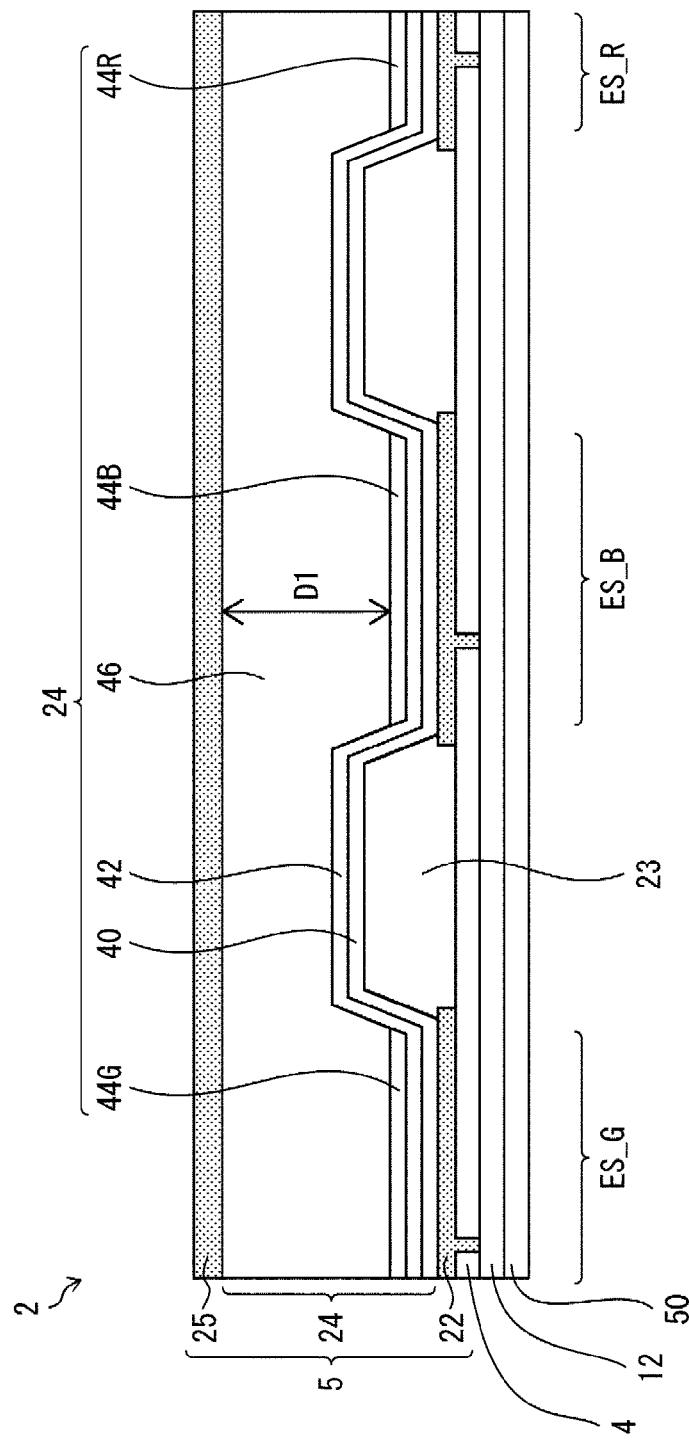

FIG. 6 is a cross-sectional view illustrating a schematic configuration of a display region of a display device according to an embodiment of the disclosure.

Figure 7:
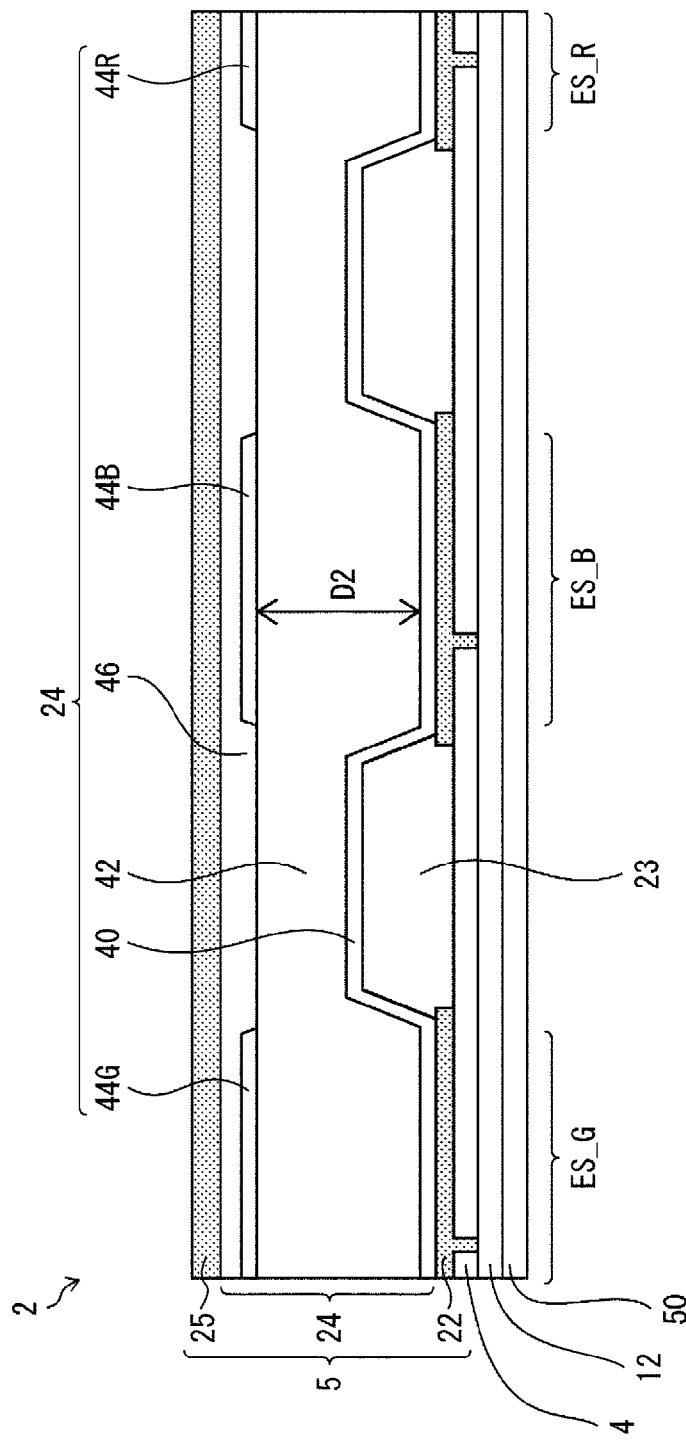

FIG. 7 is a cross-sectional view illustrating a schematic configuration of a display region of a display device according to an embodiment of the disclosure.

Figure 8:
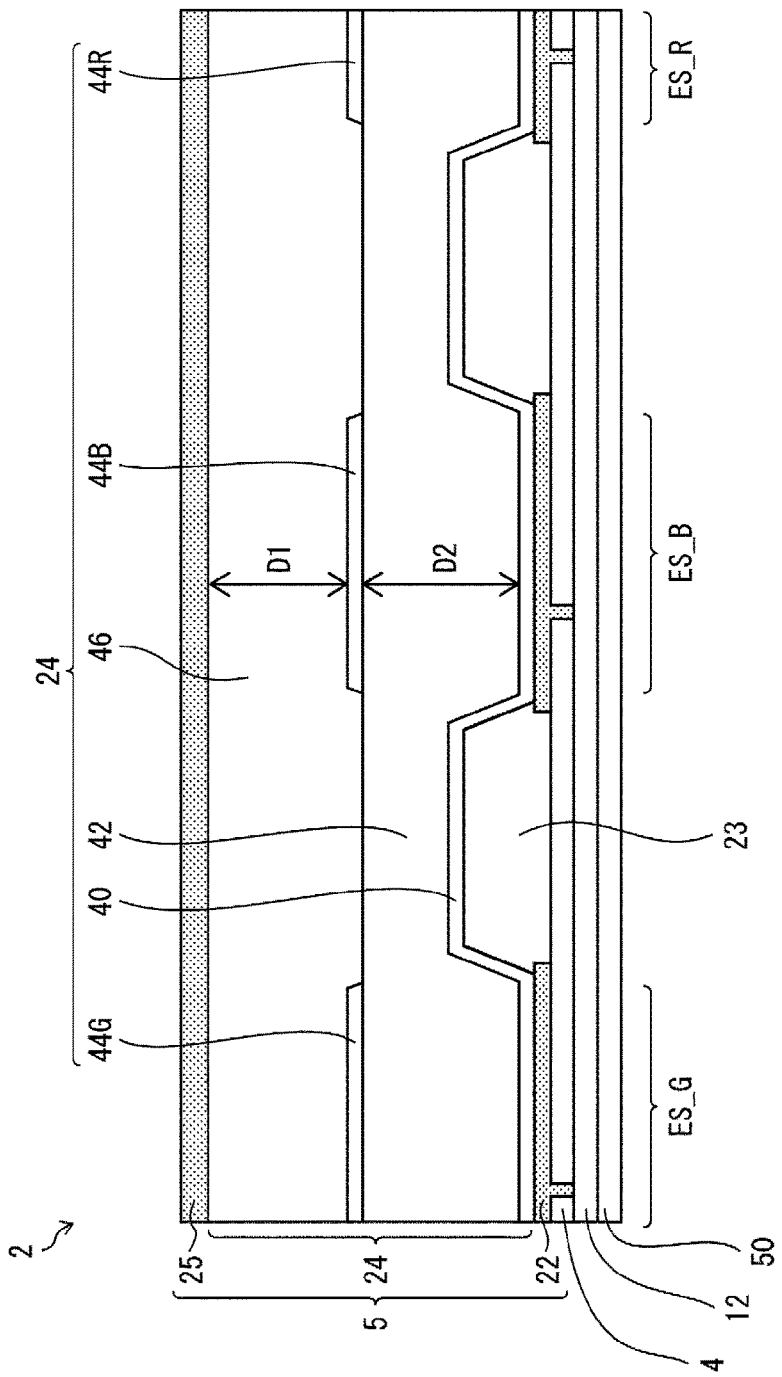

FIG. 8 is a cross-sectional view illustrating a schematic configuration of a display region of a display device according to an embodiment of the disclosure.

DESCRIPTION OF EMBODIMENTS

Method of Manufacturing Display Device and Configuration

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
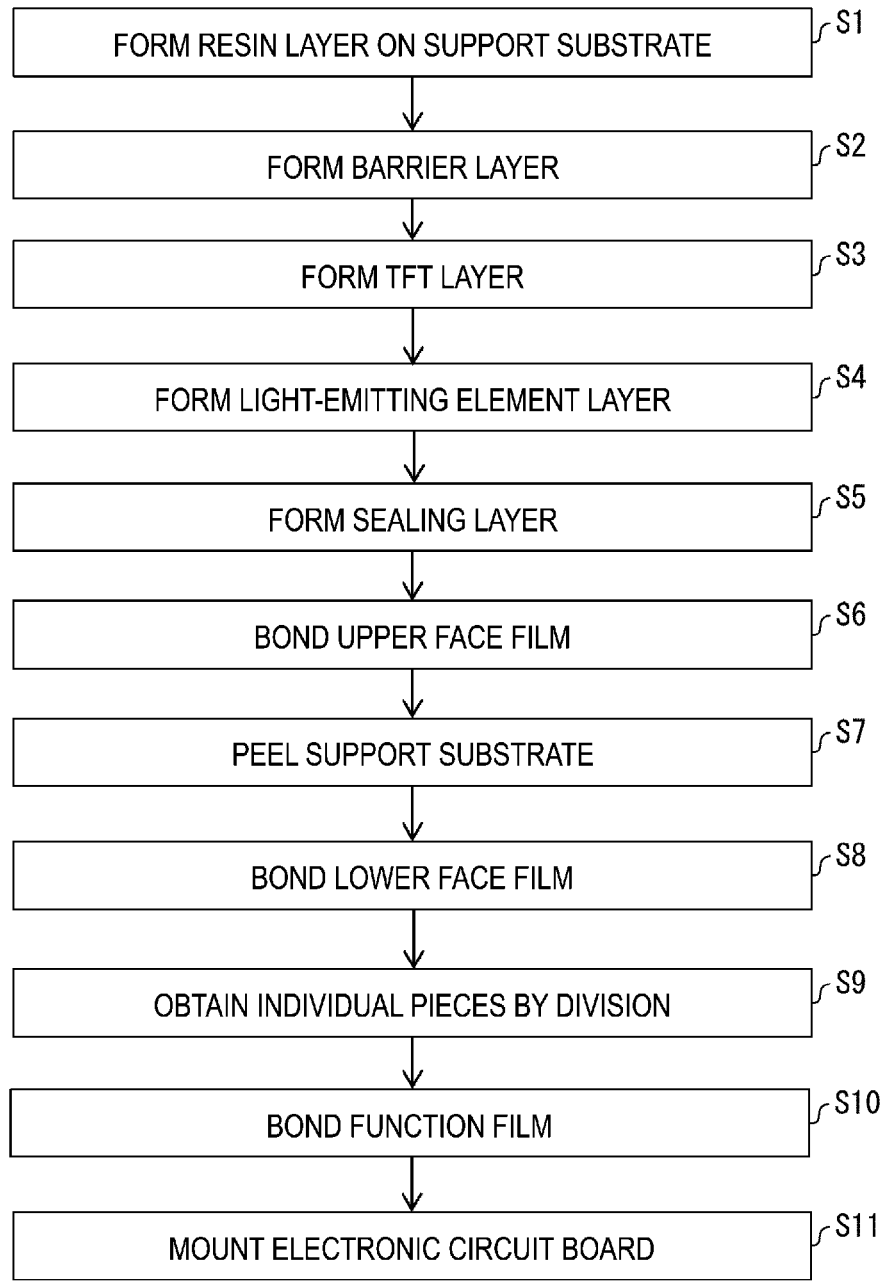
FIG. 1 is a flowchart illustrating an example of a method of manufacturing a display device according to some embodiments of the disclosure.
Figure 2:
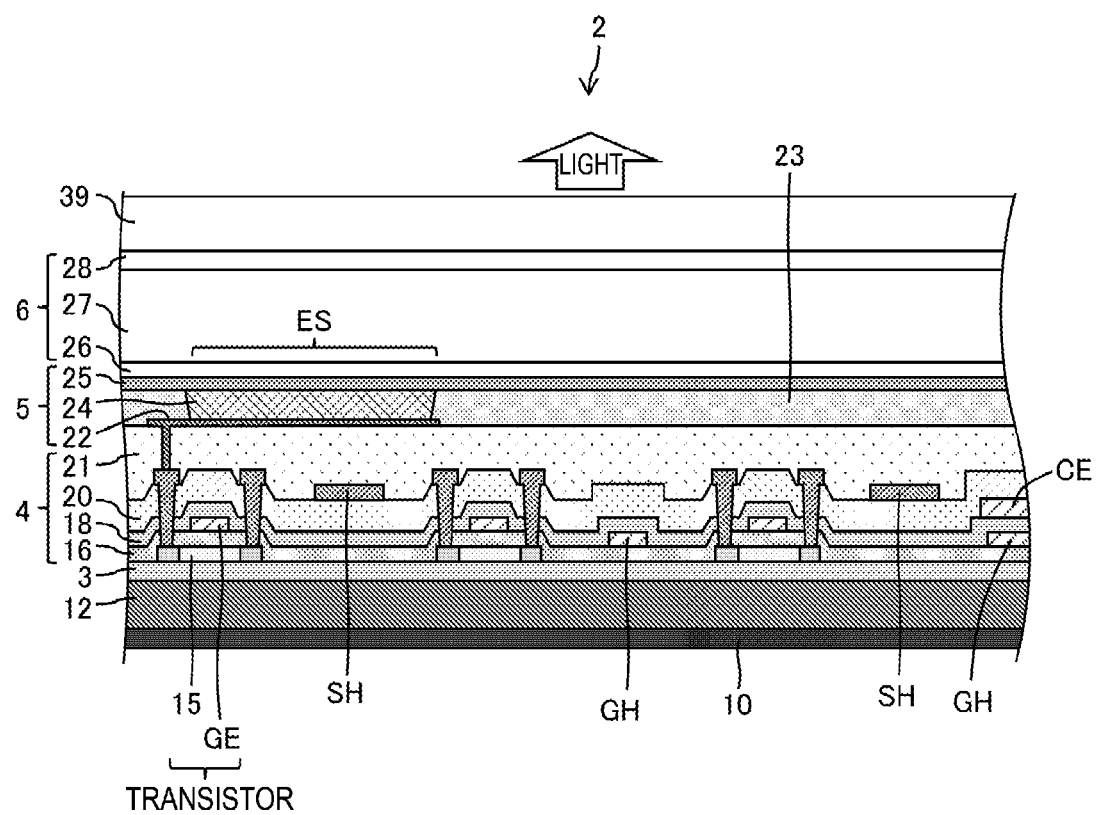
FIG. 2 is a cross-sectional view illustrating a configuration of a display region of the display device according to some embodiments of the disclosure.

FIG. 1 is a flowchart illustrating an example of a method of manufacturing a display device. FIG. 2 is a cross-sectional view illustrating the configuration of a display region of the display device 2.

In a case where a flexible display device is manufactured, as illustrated in FIG. 1 and FIG. 2, first, a resin layer 12 is formed on a light-transmissive support substrate (a mother glass, for example) (step S1). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 due to irradiation with a laser light or the like (step S7). Next, a lower face film 10 is bonded to the lower face of the resin layer 12 (step S8). Next, the layered body including the lower face film 10, the resin layer 12, the barrier layer 3, the TFT layer 4, the light-emitting element layer 5, and the sealing layer 6 is divided to obtain a plurality of individual pieces (step S9). Next, a function film 39 is bonded on the obtained individual pieces (step S10). Next, an electronic circuit board (for example, an IC chip or an FPC) is mounted on a portion (terminal portion) of the display region located further outward (a non-display region or a frame) than a portion where a plurality of subpixels are formed (step S11). Note that steps S1 to S11 are executed by a display device manufacturing apparatus (including a film formation apparatus that executes the process from step S1 to S5).

Examples of the material of the resin layer 12 include a polyimide and the like. A portion of the resin layer 12 can be replaced by two resin films (for example, polyimide films) with an inorganic insulating film sandwiched therebetween.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (gate insulating film) in an upper layer than the semiconductor film 15, a gate electrode GE and a gate wiring line GH in an upper layer than the inorganic insulating film 16, an inorganic insulating film 18 in an upper layer than the gate electrode GE and a gate wiring line GH, a capacitance electrode CE in an upper layer than the inorganic insulating film 18, an inorganic insulating film 20 in an upper layer than the capacitance electrode CE, a source wiring line SH in an upper layer than the inorganic insulating film 20, and a flattening film 21 (interlayer insulating film) in an upper layer than the source wiring line SH.

The semiconductor film 15 is constituted of, for example, a low-temperature polysilicon (LTPS) or an oxide semiconductor (for example, an In—Ga—Zn—O based semiconductor), and a transistor (TFT) is configured to include the semiconductor film 15 and the gate electrode GE. FIG. 2 illustrates the transistor that has a top gate structure, but the transistor may have a bottom gate structure.

The gate electrode GE, the gate wiring line GH, the capacitance electrode CE, and the source wiring line SH are each composed of a single layer film or a layered film of a metal, for example. including at least one of aluminum, tungsten, molybdenum, tantalum, chromium, titanium, and copper, for example. The TFT layer 4 in FIG. 2 includes a single layer of a semiconductor layer and three layers of metal layers.

Each of the inorganic insulating films 16, 18, and 20 can be formed of, for example, a silicon oxide (SiOx) film or a silicon nitride (SiNx) film, or a layered film of these, formed by using a CVD method. The flattening film 21 can be formed of, for example, a coatable organic material such as polyimide or acrylic.

The light-emitting element layer 5 includes an anode 22 (anode electrode) in an upper layer overlying the flattening film 21, an edge cover 23 having insulating properties and covering an edge of the anode 22, an electroluminescent (EL) layer 24 in an upper layer overlying the edge cover 23, and a cathode 25 (cathode electrode) in an upper layer overlying the EL layer 24. The edge cover 23 is formed by applying an organic material such as a polyimide or an acrylic and then patterning the organic material by photolithography, for example.

For each subpixel, a light-emitting element ES including the anode 22 having an island shape, the EL layer 24, and the cathode 25 and being a QLED is formed in the light-emitting element layer 5, and a subpixel circuit for controlling the light-emitting element ES is formed in the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed into an island shape at an opening of the edge cover 23 (on a subpixel-by-subpixel basis) by vapor deposition or an ink-jet method. Other layers are formed in an island shape or a solid-like shape (common layer). A configuration is also possible in which one or more layers are not formed among the hole injection layer, the hole transport layer, the electron transport layer, and the electron injection layer.

With the light-emitting layer of the QLED, for example, an island-shaped light-emitting layer (corresponding to one subpixel) can be formed by ink-jet coating a solvent having quantum dots diffused therein.

The anodes 22 are formed by layering Indium Tin Oxide (ITO) and silver (Ag) or an alloy containing Ag, for example, and have light reflectivity. The cathodes (cathode electrode) 25 can be constituted by a transparent conductive material such as a MgAg alloy (extremely thin film), ITO, or IZO (indium zinc oxide).

In the light-emitting element ES, positive holes and electrons recombine inside the light-emitting layer in response to a drive current between the anode 22 and the cathode 25, and when excitons generated due to this recombination transition from the conduction band to the valence band of the quantum dots, light (fluorescence) is emitted.

The sealing layer 6 is transparent, and includes an inorganic sealing film 26 for covering the cathode 25, an organic buffer film 27 formed as an upper layer overlying the inorganic sealing film 26, and an inorganic sealing film 28 formed as an upper layer overlying the organic buffer film 27. The sealing layer 6 covering the light-emitting element layer 5 inhibits foreign matter such as water and oxygen from penetrating the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as an acrylic. The organic buffer film 27 can be formed, for example, by ink-jet application, and a bank for stopping droplets may be provided in the non-display region.

The lower face film 10 is, for example, a PET film bonded in a lower face of the resin layer 12 after the support substrate is peeled, to realize a display device having excellent flexibility. The function film 39 has at least one of an optical compensation function, a touch sensor function, and a protection function, for example.

A flexible display device was described above, but when a non-flexible display device is to be manufactured, ordinarily, the formation of a resin layer, and the replacement of the base material, etc. are not required, and therefore, for example, the processes of layering on a glass substrate of steps S2 to step S5 are implemented, after which the manufacturing process moves to step S9. Furthermore, when a non-flexible display device is manufactured, a transparent sealing member may be caused to adhere using a sealing adhesive instead of or in addition to forming the sealing layer 6, under a nitrogen atmosphere. The transparent sealing member can be formed from glass, plastic, or the like, and preferably has a concave shape.

History of Disclosure

Hereinafter, the history of the inventors achieving the disclosure will be described simply.

The inventors repeated trial and error to reduce absorption by ZnO. The inventors measured an absorption spectrum of a layer composed of ZnO particles, rather than a sintered body of ZnO, with ZnO particles of various average particle sizes, resulting in absorption spectra illustrated in FIG. 3.

Figure 3:
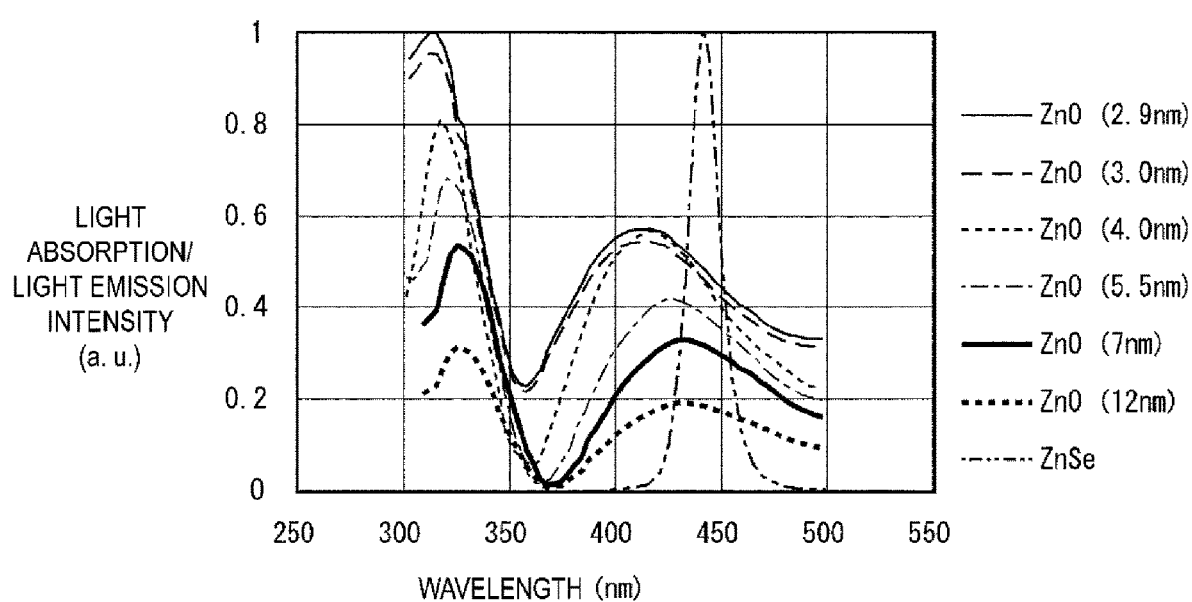
FIG. 3 is a diagram illustrating an emission spectrum of a blue light-emitting layer including ZnSe-based QDs and an absorption spectrum of a layer composed of ZnO particles.

FIG. 3 is a diagram illustrating an emission spectrum of a blue light-emitting layer including ZnSe-based QDs and absorption spectra of layers composed of ZnO particles. In FIG. 3, the emission spectrum is plotted on a scale with a peak intensity of the emission spectrum used as one unit, and all of the absorption spectra are plotted on a scale with a peak intensity of the absorption spectrum of a layer composed of ZnO particles having an average particle size of 2.9 nm used as one unit.

The layer composed of ZnO particles can be formed by applying a solution in which ZnO particles are dispersed in a film shape, and then volatilizing the solvent by baking or the like. Because the layer composed of ZnO particles is not a sintered body, there is no crystal growth by sintering. Thus, the average particle size, particle size variation, and shape of ZnO particles are equivalent in both the layer composed of ZnO particles and the solution in which ZnO particles are dispersed.

The inventors, for convenience, purchased a solvent in which ZnO particles are dispersed, and considered the nominal value of the particle size provided by the supplier as an average value. When the particle size variation was verified using a solution in which particles with a nominal particle size of 12 nm were dispersed, the particle sizes were approximately 10 nm to 14 nm. Note that this is not a limitation, the ZnO particles may be self-made, and an average value may be calculated from measurement values of particle sizes. ZnO particles can be made by heating a solution in which ZnO is dissolved, and ZnO particles can be made large by increasing the heating time and/or by increasing the heating temperature. The shape of ZnO particles is generally spherical. Within the layer composed of ZnO particles, ZnO particles overlap with each other.

From FIG. 3, the inventors have found that in the layer composed of ZnO particles, the greater the average particle size of ZnO particles, the lower the absorptivity.

The inventors made various bottom-emitting type blue light-emitting devices in which the electron injection and electron transport layer is composed of ZnO particles as described below. Then, emission spectra of the light-emitting devices were measured, resulting in the emission spectra illustrated in FIG. 4.

First, the inventors formed an ITO film having a film thickness of 100 nm as an anode on a glass substrate by sputtering. Next, as a hole injection layer, a solution containing PEDOT:PSS (a composite conductive polymer composed of poly(3,4-ethylene dioxythiophene) and polystyrene sulfonate) was applied by spin coating, and baked to volatilize the solvent, thereby forming a PEDOT:PSS film with a film thickness of 40 nm. Next, as a hole transport layer, a solution containing PVK (poly(N-vinylcarbazole)) was applied by spin coating, and baked to volatilize the solvent, thereby forming a PVK film with a film thickness of 20 nm. Next, as a blue light-emitting layer, a solution in which ZnSe-based QDs were dispersed was applied by spin coating, and baked to volatilize the solvent, thereby forming a layer containing ZnSe-based QDs with a film thickness of 20 nm. Next, as the electron injection and electron transport layer, a solution in which ZnO particles having an average particle size of 2.9 nm were dispersed was applied by spin coating, and baked to volatilize the solvent, thereby forming a layer composed of ZnO particles with a film thickness of 50 nm. Next, as a cathode, an Al film with a film thickness of 100 nm was formed by vacuum vapor deposition. Next, in an $N_2$ atmosphere, the glass substrate and the laminate thereon were sealed. In this way, the inventors made a blue light-emitting device in which the electron injection and electron transport layer was composed of ZnO particles having an average particle size of 2.9 nm. The inventors similarly made blue light-emitting devices in which the electron injection and electron transport layers were composed of ZnO particles having an average particle size of 4.0 nm, 5.5 nm, 7.0 nm, and 12 nm, respectively.

(a) of FIG. 4 is a diagram illustrating emission spectra of the blue light-emitting devices described above. In (a) of FIG. 4, the emission spectra are plotted on a scale with the peak intensities of the respective emission spectra used as one unit. (b) of FIG. 4 is an enlarged view of a portion surrounded by A in (a) of FIG. 4. As illustrated in FIG. 4, the emission spectra of the blue light-emitting devices each are affected by the electron injection and electron transport layer composed of ZnO particles, and thus, unlike the emission spectrum from the blue light-emitting layer illustrated in FIG. 3, the emission spectra are tailed from 450 nm to 650 nm. As illustrated in (a) of FIG. 4, the inventors found that the larger the average particle size of the ZnO particles constituting the electron injection and electron transport layer, the smaller the tail, that is, the higher the color purity.

As a result of examining the spectrum illustrated in FIG. 3, the inventors determined that the larger the average particle size, the lower the ratio of surface area to volume, and the absorptivity was reduced because the absorptivity depends on the surface area. Furthermore, as a result of examining the spectra illustrated in FIG. 4, the inventors determined that because fluorescence originating from surface defects of ZnO particles showed a broad region at a wavelength of from 500 nm to 530 nm, the larger the average particle size, the fewer the surface defects, and the more the fluorescence was reduced.

In addition, the inventors made various top-emitting type display devices in which the electron injection and electron transport layer was composed of ZnO particles, as described below. Then, as a result of measuring a color gamut that can be represented by the display devices, the color gamut illustrated in FIG. 5 was obtained.

First, the inventors formed an ITO film having a film thickness of 100 nm as an anode on a glass substrate by sputtering. Next, as a hole injection layer, a solution containing PEDOT:PSS was applied by an ink-jet method, and baked to volatilize the solvent, thereby forming a PEDT:PSS film with a film thickness of 40 nm. Next, as a hole transport layer, a solution containing PVK was applied by an ink-jet method, and baked to volatilize the solvent, thereby forming a PVK film with a film thickness of 20 nm. Next, as a blue light-emitting layer, a solution in which ZnSe-based QDs were dispersed was applied by an ink-jet method, and baked to volatilize the solvent, thereby forming a film containing ZnSe-based QDs with a film thickness of 20 nm. As a red light-emitting layer, a solution in which InP-based QDs were dispersed was applied by an ink-jet method and baked to volatilize the solvent, thereby forming a layer containing InP-based QDs with a film thickness of 20 nm. As a green light-emitting layer, a solution in which InP-based QDs were dispersed was applied by an ink-jet method, and baked to volatilize the solvent, thereby forming a layer containing InP-based QDs with a film thickness of 20 nm. Next, as an electron injection and electron transport layer, a solution in which ZnO particles having an average particle size of 2.9 nm were dispersed was applied by an ink-jet method, and baked to volatilize the solvent, thereby forming a layer composed of ZnO particles with a film thickness of 50 nm. Next, as a cathode, an Ag film with a film thickness of 20 nm was formed by vacuum vapor deposition. Next, in an $N_2$ atmosphere, the glass substrate and the laminate thereon were sealed. In this way, the inventors made a display device in which the electron injection and electron transport layer was composed of ZnO particles having an average particle size of 2.9 nm. The inventors similarly made display devices in which the electron injection and electron transport layer composed of ZnO particles having an average particle size of 4.0 nm, 5.5 nm, 7.0 nm, and 12 nm, respectively.

(a) of FIG. 5 is a CIE (International Commission on Illumination) 1931 xy chromaticity diagram showing BT.2020 (color gamut standard specified in Broadcasting service television, 2020) and the color gamut that the light-emitting devices described above can represent. (b) of FIG. 5 is an enlarged view of a portion surrounded by B in (a) of FIG. 5.

As shown in FIG. 5, the inventors found that the larger the average particle size of ZnO particles is, the more that the blue vertexes of the triangular-shaped representable color gamut shift to the bottom left (−y direction and −x direction), thus the cover ratio of BT.2020 being improved.

Table 1 shows xy coordinates of the red vertex (Red_x, Red_y), xy coordinates of the green vertex (Green_x, Green_y), and xy coordinates of the blue vertex (Blue_x, Blue_y) of the triangle of BT.2020 shown in FIG. 5.

TABLE 1

|  | BT. 2020 |
|---|---|
| Red_x | 0.708 |
| Red_y | 0.292 |
| Green_x | 0.17 |
| Green_y | 0.797 |
| Blue_x | 0.131 |
| Blue_y | 0.046 |

Table 2 shows xy coordinates of the white center (White_x, White_y), xy coordinates (Red_x, Red_y) of red vertexes, xy coordinates of green vertexes (Green_x, Green_y), and xy coordinates of blue vertexes (Blue_x, Blue_y) of the triangular color gamut of the various display devices shown in FIG. 5, BT.2020 area ratio (BT. 2020 area), and BT.2020 cover ratio (BT. 2020 cover).

TABLE 2

|  | ZnSe + ZnO (2.9 nm) | ZnSe + ZnO (3.0 nm) | ZnSe + ZnO (4.0 nm) | ZnSe + ZnO (5.5 nm) | ZnSe + ZnO (7 nm) | ZnSe + ZnO (12 nm) |
|---|---|---|---|---|---|---|
| White_x | 0.2808 | 0.2808 | 0.2807 | 0.2805 | 0.2807 | 0.2806 |
| White_y | 0.2883 | 0.2883 | 0.2882 | 0.2884 | 0.2883 | 0.2884 |
| Red_x | 0.6769 | 0.6769 | 0.6769 | 0.6769 | 0.6769 | 0.6769 |
| Red_y | 0.3228 | 0.3228 | 0.3228 | 0.3228 | 0.3228 | 0.3228 |
| Green_x | 0.2698 | 0.2698 | 0.2698 | 0.2698 | 0.2698 | 0.2698 |
| Green_y | 0.6957 | 0.6957 | 0.6957 | 0.6957 | 0.6957 | 0.6957 |
| Blue_x | 0.1701 | 0.1698 | 0.1702 | 0.1658 | 0.1640 | 0.1620 |
| Blue_y | 0.0760 | 0.0736 | 0.0571 | 0.0363 | 0.0283 | 0.0191 |
| BT. 2020 area | 68.3% | 68.6% | 70.1% | 72.5% | 73.4% | 74.5% |
| BT. 2020 cover | 68.3% | 68.5% | 70.0% | 71.4% | 71.8% | 72.2% |

As shown in Table 2, the cover ratio of BT.2020 of the light-emitting device is less than 70% when the average particle size of ZnO particles is less than 2.9 nm, while the cover ratio of BT.2020 is 70% or greater when the average particle size of ZnO particles is 4 nm or greater. For this reason, the inventors determined that when the average particle size of ZnO particles is 3 nm or greater, the cover ratio of BT.2020 of the light-emitting device is 68.6% or greater, and the light-emitting device described above is applicable to the display device. 68.6% is a fairly high value as the cover ratio of BT.2020 of a Cd-free QLED display device, and is a value suitable for practical use as a display device.

The inventors have invented the disclosure based on the foregoing findings. Of the blue light-emitting devices and the display devices described above, those in which the average particle size of ZnO particles constituting the electron injection and electron transport layer is 3 nm or greater and 30 nm or less are within the scope of the disclosure.

First Embodiment

Hereinafter, an embodiment of the disclosure will be described in detail with reference to the drawings. However, shapes, dimensions, relative arrangements, and the like illustrated in the drawings are merely exemplary, and the scope of the disclosure should not be construed as limiting due to these.

FIG. 6 is a cross-sectional view illustrating a schematic configuration of a display region of a display device 2 according to the present embodiment. In FIG. 6, an electron injection and electron transport layer 46 is depicted thicker than the other layers, but this is unrelated to the actual thickness of the electron injection and electron transport layer 46 and the thickness relationship with the other layers.

As illustrated in FIG. 6, an EL layer 24 includes a layered structure in which a hole injection layer 40, a hole transport layer 42, and an electron injection and electron transport layer 46 are layered in this order between an anode 22 and a cathode 25. In addition, between the hole transport layer 42 and the electron injection and electron transport layer 46, a red light-emitting layer 44R is formed in the region where a red light-emitting element ES_R (electroluminescent element, red pixel) is formed, a green light-emitting layer 44G is formed in the region where a green light-emitting element ES_G (electroluminescent element, green pixel) is formed, and a blue light-emitting layer 44B is formed in the region where a blue light-emitting element ES_B (electroluminescent element, blue pixel) is formed. The anode 22 is formed in an island shape so as to correspond to each of the formation regions of the red light-emitting element ES_R, the green light-emitting element ES_G, and the blue light-emitting element ES_B. The cathode 25, the hole injection layer 40, the hole transport layer 42, and the electron injection and electron transport layer 46 are formed over the entire surface so as to be common for the red light-emitting element ES_R, the green light-emitting element ES_G, and the blue light-emitting element ES_B.

Note that the EL layer 24 is not limited to the example of the layered structure illustrated in FIG. 6, and a desired layered structure can be adopted depending on required properties of the EL layer. In the EL layer 24, for example, a hole injection and hole transport layer in which the hole transport layer and the hole injection layer are integrated may be provided; a unique hole transport layer may be provided for any of the color light-emitting layers; a hole blocking layer may be provided; an electron blocking layer may be provided; a unique electron transport layer may be provided for any of the color light-emitting layers; and an electron transport layer and an electron injection layer may be provided separately. The hole blocking layer suppresses transport of holes and the electron blocking layer suppresses transport of electrons. Thus, by providing one or both of the hole blocking layer and the electron blocking layer, it is possible to adjust the balance of charges (i.e., the balance between electrons and holes) to be supplied to the light-emitting layers.

The anode 22 can be formed by sputtering, film vapor deposition, vacuum vapor deposition, physical vapor deposition (PVD), or the like. The anode 22 is preferably composed of a conductive material with a larger work function than the cathode 25. The anode 22 is preferably a light reflective electrode capable of reflecting light emitted from the light-emitting layers 44R, 44G, 44B when the display device 2 emits light to the cathode 25 side. When the display device 2 emits light from the anode 22 side to the outside, the anode 22 is preferably a light transmissive electrode capable of transmitting light emitted from the light-emitting layers 44R, 44G, 44B, and is preferably composed of, for example, tin-doped indium oxide (ITO), zinc-doped indium oxide (IZO), aluminum-doped zinc oxide (AZO), gallium-doped zinc oxide (GZO), antimony-doped tin oxide (ATO), or the like.

The hole injection layer 40 is a layer that transports holes supplied from the anode 22 to the hole transport layer 42. The material of the hole injection layer 40 may be an organic material or an inorganic material. When the material of the hole injection layer 40 is an organic material, it only needs to be a conductive polymer material or the like, and for example, a composite of poly(3,4-ethylene dioxythiophene): polystyrene sulfonate (PEDOT:PSS), or the like can be used.

The hole transport layer 42 is a layer that transports holes supplied from the hole injection layer 40 to the light-emitting layers 44R, 44G, 44B. The material of the hole transport layer 42 may be an organic material or an inorganic material other than ZnO particles. When the material of the hole transport layer 42 is an organic material, it only needs to be a conductive polymer material or the like, and for example, poly(N-vinylcarbazole) (PVK), or the like can be used. If only the hole transport layer 42 can sufficiently supply holes to the light-emitting layers 44R, 44G, 44B, the hole injection layer 40 does not need to be provided. The hole injection layer 40 and the hole transport layer 42 can be formed by sputtering, vacuum vapor deposition, physical vapor deposition, spin coating, an ink-jet method, or the like.

The light-emitting layers 44R, 44B, 44G of respective colors include QDs capable of emitting light of the respective colors. Each QD includes a nanocrystal of phosphor and emits light in association with connection between holes supplied through the hole transport layer 42 from the anode 22 and electrons supplied through the electron injection and electron transport layer 46 from the cathode 25. Each QD may have a core-shell structure in which the outer periphery of the nanocrystal of the phosphor is covered by another material having a different bandgap. Also, each QD preferably has its surface modified with a ligand to increase dispersibility. The light-emitting layers 44R, 44B, 44G are preferably formed by using a technique such as spin coating, an ink-jet method, photolithography, or the like.

The QDs included in the red light-emitting layer 44R and the green light-emitting layer 44G preferably include at least one material selected from the group consisting of Si; Se; Ga-based materials including GaN, GaP, $Ga_2O_3$, and $Ga_2S_3$; Ge; Cd-based materials including CdS, CdSe, CdTe, and CdO; In-based materials including InP, InN, $In_2S_3$, InGaN, AlInN, AlGaInN, and CuInGa; Sn-based materials including SnS, SnSe, and SnTe; and Pb-based materials including PbS, PbSe, and PbTe. The QDs included in the red light-emitting layer 44R and the green light-emitting layer 44G may include nanocrystals formed from the same material or may include nanocrystals formed from different materials.

The QDs included in the red light-emitting layer 44R and the green light-emitting layer 44G are preferably Cd-free, and for example, preferably include InP-based quantum dots (InP-based QDs) including InP. For example, the QDs included in the red light-emitting layer 44R can include nanocrystals of InP having an average particle size of 3.5 nm as a core, and the QDs included in the green light-emitting layer 44G can include nanocrystals of InP having an average particle size of 2.0 nm as a core. Here, the average particle size of the cores of the QDs is a median particle size (median) measured by a dynamic light scattering method. The method for measuring the average particle size is not limited to the dynamic light scattering method. The average particle size is not limited to a median, and may be an arithmetic average value, a geometric average value, a mode value, or the like.

The QDs included in the blue light-emitting layer 44B are preferably QDs in which the emission spectrum has an emission peak in a wavelength range of 400 nm or greater and 460 nm or less, and are preferably, for example, ZnSe-based quantum dots (ZnSe-based QDs) containing ZnSe nanocrystals with an average particle size of 3.5 nm as the core. One of the regions in which the absorption spectrum of the layer composed of ZnO particles is high is located in a wavelength range of approximately 400 nm or greater and 460 nm or less (see FIG. 3). For this reason, against the problem that occurs in the light-emitting layer including the QDs having the emission peak in the wavelength range of 400 nm or greater and 460 nm or less, the present embodiment can reduce the absorption spectrum of the layer composed of ZnO particles, which achieves an effect.

The electron injection and electron transport layer 46 is composed of ZnO particles. Such an electron injection and electron transport layer 46 can be formed by first dispersing ZnO particles in a solvent such as ethanol, then applying a solution in which ZnO particles are dispersed on the respective color light-emitting layers 44R, 44B, 44G and the hole transport layer 42 by spin coating, an ink-jet method, or the like, and then volatilizing the solvent by baking or the like. Because it is not a sintered body, there is no crystal growth by sintering. Thus, the ZnO particles in the electron injection and electron transport layer 46 have the same average particle size as before dispersion in the solvent, and are substantially spherical as before dispersion. Because the electron injection and electron transport layer 46 has an internal structure in which substantially spherical ZnO particles overlap with each other, the larger the particle size of the ZnO particles, the smaller the contact area with the light-emitting layer per unit area. Thus, if the electron injection and electron transport layer 46 is formed from ZnO particles having an average particle size of greater than 30 nm, the electron transport efficiency decreases. On the other hand, as described in the history of the disclosure described above, the luminous efficiency and the color purity are improved when the average particle size of the ZnO particles constituting the electron injection and electron transport layer 46 is 3 nm or greater. Thus, the electron injection and electron transport layer 46 is composed of ZnO particles having an average particle size of 3 nm or greater and 30 nm or less.

With reference again to Table 2, when the average particle size of the ZnO particles is 4 nm or greater, the cover ratio of BT.2020 of the light-emitting device is 70% or greater. From the average particle size of the ZnO particles exceeding about 10 nm, the contact area with the light-emitting layer per unit area decreases, and the electron injection efficiency of the electron injection and electron transport layer 46 decreases (not so much as when the average particle size exceeds 30 nm). With reference again to FIG. 5, when the average particle size of the ZnO particles is 12 nm, no fluorescence originating from surface defects of the ZnO particles is emitted. Thus, the average particle size of the ZnO particles is preferably 12 nm or less, with which both the color purity and the electron injection efficiency are achieved. Therefore, the electron injection and electron transport layer 46 preferably includes ZnO particles having an average particle size of 4 nm or greater and 12 nm or less.

Furthermore, when the film thickness of the electron injection and electron transport layer 46 is greater than 100 nm, since the electrical resistance is high, the electron injection efficiency decreases, and the luminous efficiency of the light-emitting elements ES_R, ES_G, ES_B may be reduced. If the film thickness of the electron injection and electron transport layer 46 is less than 30 nm, hole blocking at the electron injection and electron transport layer 46 cannot be performed due to a tunneling effect or the like. Because hole blocking cannot be performed, recombination between holes injected from the hole transport layer 42 and electrons injected from the electron injection and electron transport layer 46 may occur in a portion other than the light-emitting layers 44R, 44G, 44B, which may reduce the luminous efficiency. Due to these, the electron injection and electron transport layer 46 preferably has an average film thickness of 30 nm or greater and 100 nm or less. Furthermore, it is known that, as a rule of experience in an electroluminescent element using Cd-containing QDs, it is known that when the film thickness of the electron transport layer composed of ZnO particles is 50 nm or greater and 80 nm or less, the light emission property is better than when it is 30 nm or greater and less than 50 nm and when it is greater than 80 nm and 100 nm or less. Thus, the electron injection and electron transport layer 46 preferably has an average film thickness of 50 nm or greater and 80 nm or less.

In addition, when a layer made of ZnO particles is formed, a gap of the same size as one ZnO particle may occur between the ZnO particles. When the average film thickness of the electron injection and electron transport layer 46 is less than three particle layers (that is, less than three times the average particle size of the ZnO particles that make up the electron injection and electron transport layer 46), the presence of such a gap easily produces a location where the light-emitting layers 44R, 44G, 44B are in direct contact with the cathode 25 without the electron injection and electron transport layer 46 interposed therebetween. Such direct contact may cause leakage current that electrons are injected directly from the cathode 25 to the light-emitting layers 44R, 44G, 44B. Such leakage current increases the injection barrier to the light-emitting layers 44R, 44G, 44B, which may cause an increase in the drive voltage of the light-emitting elements ES_R, ES_G, ES_B and/or light emission spots. Thus, the electron injection and electron transport layer 46 preferably has an average film thickness of three or more particle layers.

The electron injection and electron transport layer 46 is typically formed over the entire display region of the display device 2. Thus, the film thickness of the electron injection and electron transport layer 46 may be affected by the unevenness of the lower structure. In this case, the average of a film thickness D1 of a portion of the electron injection and electron transport layer 46, which overlaps with the light-emitting layers 44R, 44G, 44B, only needs to satisfy the aforementioned average film thickness conditions. From the perspective of manufacturing efficiency, the electron injection and electron transport layer 46 is preferably formed in common for the red light-emitting element ES_R, the blue light-emitting element ES_B, and the green light-emitting element ES_G. However, the disclosure is not limited thereto, and the light-emitting elements may be formed separately.

The cathode 25 can be formed by using sputtering, film vapor deposition, vacuum vapor deposition, physical vapor deposition (PVD), or the like. The cathode 25 is preferably composed of a conductive material having a smaller work function than the anode 22. The cathode 25 is preferably a light transmissive electrode capable of transmitting light emitted from the light-emitting layers 44R, 44G, 44B when the display device 2 emits light from the cathode 25 side to the outside. The cathode 25 is preferably a light reflective electrode capable of reflecting light emitted from the light-emitting layers 44R, 44G, 44B when the display device 2 emits light from the anode 22 side to the outside, and is preferably composed of, for example, Al, Ag, Ba, Yb, Ca, Li—Al alloy, Mg—Al alloy, Mg—Ag alloy, Mg—In alloy, Al—Al2O3 alloy, or the like.

Modification

The blue light-emitting element ES_B (electroluminescent element) and the display device 2 according to the present embodiment are not limited to the top-emitting type illustrated in FIG. 6, but may be of a bottom-emitting type.

Additionally or alternatively, in the blue light-emitting element ES_B (electroluminescent element) and the display device 2 according to the present embodiment, the layered order of the anode 22, the cathode 25, and the layers in the EL layer 24 between the anode 22 and the cathode 25 may be turned upside down. Specifically, the cathode 25, the electron injection and electron transport layer 46, the hole transport layer 42, and the hole injection layer 40 of the EL layer 24, and the anode 22 may be layered in this order on the TFT layer 4, and the red light-emitting layer 44R, the green light-emitting layer 44G, and the blue light-emitting layer 44B may be formed between the hole transport layer 42 and the electron injection and electron transport layer 46.

The blue light-emitting element ES_B (electroluminescent element) according to the present embodiment is provided as a blue pixel in an RGB display device, but the embodiment is not limited thereto. For example, the blue light-emitting layer 44_B may be changed to a light-emitting layer capable of emitting light of another color. For example, the blue light-emitting layer 44_B may be used in a single color display device.

Second Embodiment

Hereinafter, an embodiment of the disclosure will be described in detail with reference to FIG. 7. Note that, for the convenience of description, members having the same functions as the members described in the foregoing embodiments will be given the same reference signs, and descriptions thereof will not be reiterated.

FIG. 7 is a cross-sectional view illustrating a schematic configuration of a display region of a display device 2 according to the present embodiment. In FIG. 7, the hole transport layer 42 is depicted thicker than the other layers, but this is unrelated to the actual thickness of the hole transport layer 42 and the thickness relationship with the other layers.

In the first embodiment described above, the electron injection and electron transport layer 46 is composed of ZnO particles, and the hole transport layer 42 is composed of another material. On the other hand, in the present embodiment, the hole transport layer 42 is composed of ZnO particles, and the electron injection and electron transport layer 46 is composed of another material. When ZnO particles are used for the hole transport layer 42, N (nitrogen) or the like is preferably doped with ZnO to form a p-type semiconductor. Furthermore, because electron blocking cannot be sufficiently performed by ZnO alone, a film of a material used in the related art as a hole transport material is preferably formed in a range of 1 nm or greater and 10 nm or less between the ZnO particle layer and a light-emitting layer.

The electron injection and electron transport layer 46 in the present embodiment may be composed of an organic material or an inorganic material other than ZnO particles. When the material of the electron injection and electron transport layer 46 is an organic material, it only needs to be a conductive polymer material or the like, and for example, TPBi (1,3,5-tris (1-phenyl-1H-benzoimidazol-2-yl)benzene) or the like can be used.

The QDs included in the light-emitting layers 44R, 44G, 44B emit light to the cathode 25 side as well as to the anode 22 side. The light emitted to the anode 22 side passes through the hole transport layer 42, is reflected at the anode 22, passes through the hole transport layer 42 again, passes through any of the light-emitting layers 44R, 44G, 44B, the electron injection and electron transport layer 46, and the cathode 25, and is emitted to the outside. Thus, the emission spectrum of the blue light-emitting element ES_B is affected not only by the electron injection and electron transport layer 46, but also by the hole transport layer 42.

Therefore, it is also beneficial that instead of the electron injection and electron transport layer 46, the hole transport layer 42 is composed of ZnO particles having an average particle size of 3 nm or greater and 30 nm or less. Similarly, the hole transport layer 42 is also preferably composed of ZnO particles having an average particle size of 4 nm or greater and 12 nm or less, more preferably has an average film thickness of 30 nm or greater and 100 nm or less, and even more preferably has an average film thickness of three times or more the average particle size of the ZnO particles. The average of a film thickness D2 of a portion of the hole transport layer 42, which overlaps with the light-emitting layers 44R, 44G, 44B, only needs to satisfy the aforementioned average film thickness conditions.

The effect on the emission spectrum of the display device 2 is greater by the charge transport layer (one of the electron transport layer and the hole transport layer) provided on the emission side, which is the side on which the display device 2 emits light to the outside, with respect to the light-emitting layers 44R, 44G, 44B, than the charge transport layer provided on the opposite side of the emission side (the other of the electron transport layer and the hole transport layer). Thus, when the display device 2 emits light from the cathode 25 side to the outside, the electron injection and electron transport layer 46 is preferably composed of ZnO particles as in the first embodiment described above. On the other hand, when the display device 2 emits light from the anode 22 side to the outside, the hole transport layer 42 is preferably composed of ZnO particles, as in the present embodiment.

Third Embodiment

Hereinafter, an embodiment of the disclosure will be described in detail with reference to FIG. 8. Note that, for the convenience of description, members having the same functions as the members described in the foregoing embodiments will be given the same reference signs, and descriptions thereof will not be reiterated.

FIG. 8 is a cross-sectional view illustrating a schematic configuration of a display region of a display device 2 according to the present embodiment. In FIG. 8, the hole transport layer 42 and the electron injection and electron transport layer 46 are depicted thicker than the other layers, but this is unrelated to the actual thicknesses of the hole transport layer 42 and the electron injection and electron transport layer 46, and the thickness relationship with the other layers.

In the first embodiment described above, only one of the hole transport layer 42 and the electron injection and electron transport layer 46 is composed of ZnO particles and the other is composed of another material. On the other hand, in the present embodiment, both the hole transport layer 42 and the electron injection and electron transport layer 46 are composed of ZnO particles.

It is also beneficial that instead of any one of the hole transport layer 42 and the electron injection and electron transport layer 46, both of them are compose of ZnO particles having an average particle size of 3 nm or greater and 30 nm or less.

Supplement

An electroluminescent element according to a first aspect of the disclosure is an electroluminescent element including: a pair of a cathode electrode and an anode electrode; a light-emitting layer provided between the cathode electrode and the anode electrode; an electron transport layer provided between the cathode electrode and the light-emitting layer; and a hole transport layer provided between the anode electrode and the light-emitting layer, and having a configuration in which the light-emitting layer includes ZnSe-based quantum dots containing ZnSe and one of the electron transport layer and the hole transport layer is composed of ZnO particles having an average particle size of 3 nm or greater and 30 nm or less.

An electroluminescent element according to a second aspect of the disclosure may have a configuration in which the one of the electron transport layer and the hole transport layer is composed of ZnO particles having an average particle size of 4 nm or greater and 12 nm or less in the first aspect.

An electroluminescent element according to a third aspect of the disclosure may have a configuration in which the one of the electron transport layer and the hole transport layer has an average film thickness of 30 nm or greater and 100 nm or less in the first aspect.

An electroluminescent element according to a fourth aspect of the disclosure may have a configuration in which the average film thickness of the one of the electron transport layer and the hole transport layer is three times or more the average particle size of the ZnO particles in the third aspect.

An electroluminescent element according to a fifth aspect of the disclosure may have a configuration in which the average film thickness of the one of the electron transport layer and the hole transport layer is an average of a film thickness of a portion of the one of the electron transport layer and the hole transport layer in the third aspect, the portion overlapping with the light-emitting layer.

An electroluminescent element according to a sixth aspect of the disclosure may have a configuration in which an emission spectrum of the ZnSe-based quantum dots has an emission peak in a wavelength range of 400 nm or greater and to 460 nm or less in the first aspect.

An electroluminescent element according to a seventh aspect of the disclosure may have a configuration in which the cathode electrode may be a light transmissive electrode capable of transmitting light emitted by the light-emitting layer, and the anode electrode may be a light reflective electrode capable of reflecting light emitted by the light-emitting layer in the first aspect.

An electroluminescent element according to an eighth aspect of the disclosure may have a configuration in which the anode electrode may be a light transmissive electrode capable of transmitting light emitted by the light-emitting layer, and the cathode electrode may be a light reflective electrode capable of reflecting light emitted by the light-emitting layer in the first aspect.

An electroluminescent element according to a ninth aspect of the disclosure may have a configuration in which the other one of the electron transport layer and the hole transport layer is composed of a material other than ZnO particles in the first aspect.

A display device according to a tenth aspect of the disclosure includes the electroluminescent element according to any one of the first to ninth aspects of the disclosure as a blue pixel, another electroluminescent element as a red pixel, and yet another electroluminescent element as a green pixel.

A display device according to an eleventh aspect of the disclosure may have a configuration in which a light-emitting layer included in the red pixel includes quantum dots containing at least one material selected from the group consisting of: Si; Se; Ga-based materials including GaN, GaP, $Ga_2O_3$, and $Ga_2S_3$; Ge; Cd-based materials including CdS, CdSe, CdTe, and CdO; In-based materials including InP, InN, $In_2S_3$, InGaN, AlInN, AlGaInN, and CuInGa; Sn-based materials including SnS, SnSe, and SnTe; and Pb-based materials including PbS, PbSe, and PbTe, and a light-emitting layer included in the green pixel includes quantum dots containing at least one material selected from the group in the tenth aspect.

A display device according to a twelfth aspect of the disclosure may have a configuration in which the light-emitting layer of at least one of the blue pixel, the red pixel, and the green pixel includes InP-based quantum dots containing InP in the eleventh aspect.

A display device according to a thirteenth aspect of the disclosure may have a configuration in which the light-emitting layers of both the red pixel and the green pixel include the InP-based quantum dots in the twelfth aspect.

The disclosure is not limited to each of the embodiments described above, and various modifications may be made within the scope of the claims. Embodiments obtained by appropriately combining technical approaches disclosed in each of the different embodiments also fall within the technical scope of the present invention. Moreover, novel technical features can be formed by combining the technical approaches disclosed in the embodiments.

The invention claimed is:

1. An electroluminescent element comprising:
a pair of a cathode electrode and an anode electrode;
a light-emitting layer provided between the cathode electrode and the anode electrode;
an electron transport layer provided between the cathode electrode and the light-emitting layer; and
a hole transport layer provided between the anode electrode and the light-emitting layer,
wherein the light-emitting layer includes ZnSe-based quantum dots including ZnSe, and
one of the electron transport layer and the hole transport layer is composed of ZnO particles having an average particle size of 3 nm or greater and 30 nm or less.

2. The electroluminescent element according to claim 1, wherein the one of the electron transport layer and the hole transport layer is composed of ZnO particles having an average particle size of 4 nm or greater and 12 nm or less.

3. The electroluminescent element according to claim 1, wherein an average film thickness of the one of the electron transport layer and the hole transport layer is 30 nm or greater and 100 nm or less.

4. The electroluminescent element according to claim 3, wherein the average film thickness of the one of the electron transport layer and the hole transport layer is three times or more the average particle size of the ZnO particles.

5. The electroluminescent element according to claim 3, wherein the average film thickness of the one of the electron transport layer and the hole transport layer is an average of a film thickness of a portion of the one of the electron transport layer and the hole transport layer, the portion overlapping with the light-emitting layer.

6. The electroluminescent element according to claim 1, wherein an emission spectrum of the ZnSe-based quantum dots has an emission peak in a wavelength range of 400 nm or greater and 460 nm or less.

7. The electroluminescent element according to claim 1, wherein the cathode electrode is a light transmissive electrode capable of transmitting light emitted by the light-emitting layer, and
the anode electrode is a light reflective electrode capable of reflecting light emitted by the light-emitting layer.

8. The electroluminescent element according to claim 1, wherein the anode electrode is a light transmissive electrode capable of transmitting light emitted by the light-emitting layer, and
the cathode electrode is a light reflective electrode capable of reflecting light emitted by the light-emitting layer.

9. A display device comprising:
the electroluminescent element recited in claim 1 as a blue pixel;
another electroluminescent element as a red pixel; and
yet another electroluminescent element as a green pixel.

10. The display device according to claim 9, wherein a light-emitting layer included in the red pixel comprises quantum dots including at least one material selected from the group consisting of:
Si;
Se;
Ga-based materials including GaN, GaP, $Ga_2O_3$, and $Ga_2S_3$;
Ge;
Cd-based materials including CdS, CdSe, CdTe, and CdO;
In-based materials including InP, InN, $In_2S_3$, InGaN, AlInN, AlGaInN, and CuInGa;
Sn-based materials including SnS, SnSe and SnTe; and
Pb-based materials including PbS, PbSe, and PbTe, and
a light-emitting layer included in the green pixel comprises quantum dots including at least one material selected from the group.

11. The display device according to claim 10, wherein the light-emitting layer of at least one of the blue pixel, the red pixel, and the green pixel comprises InP-based quantum dots including InP.

12. The display device according to claim 11, wherein the light-emitting layers of both the red pixel and the green pixel comprise the InP-based quantum dots.

* * * * *